United States Patent
Baek

(10) Patent No.: US 6,534,810 B2
(45) Date of Patent: Mar. 18, 2003

(54) SEMICONDUCTOR MEMORY DEVICE HAVING CAPACITOR STRUCTURE FORMED IN PROXIMITY TO CORRESPONDING TRANSISTOR

(75) Inventor: Yong-Ku Baek, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/749,621

(22) Filed: Dec. 28, 2000

(65) Prior Publication Data

US 2001/0019140 A1 Sep. 6, 2001

(30) Foreign Application Priority Data

Dec. 28, 1999 (KR) ............................................. 99-64053

(51) Int. Cl.[7] .......................... H01L 29/94; H01L 29/76; H01L 31/062; H01L 31/113; H01L 31/119
(52) U.S. Cl. .......................... 257/296; 257/301; 257/303; 257/306; 257/308
(58) Field of Search .................................. 257/295–313

(56) References Cited

U.S. PATENT DOCUMENTS

| 5,093,274 A | 3/1992 | Kohno |
| 5,533,635 A | 7/1996 | Man |
| 5,688,706 A | 11/1997 | Tseng |
| 5,922,623 A | 7/1999 | Tsutsui et al. |
| 6,004,850 A | 12/1999 | Lucas |

*Primary Examiner*—Eddie Lee
*Assistant Examiner*—Jesse A. Fenty
(74) *Attorney, Agent, or Firm*—Pillsbury Winthrop LLP

(57) ABSTRACT

A semiconductor memory device including an active matrix comprising a semiconductor substrate, a transistor formed on the semiconductor substrate and isolation regions for isolating the transistor, a first metal pattern formed on top of the active matrix and extending outside the transistor, a capacitor structure formed over the transistor, a barrier layer formed on top of the capacitor structure to improve thermal stability, and a second metal pattern formed on top of the capacitor structure to electrically connect the capacitor structure to the transistor through the first and second metal patterns.

7 Claims, 6 Drawing Sheets

SEMICONDUCTOR MEMORY DEVICE HAVING CAPACITOR STRUCTURE FORMED IN PROXIMITY TO CORRESPONDING TRANSISTOR

FIELD OF THE INVENTION

The present invention relates to a semiconductor memory device and, more particularly, to a semiconductor memory device having a compact cell size and a method for the manufacture thereof by forming a capacitor structure over a transistor and connecting each other indirectly.

DESCRIPTION OF THE PRIOR ART

As is well known, a dynamic random access memory (DRAM) having memory cells comprising a transistor and a capacitor achieve higher degrees of integration mainly by down-sizing the memory cells through miniaturization of the components. However, despite the high levels of integration that have been achieved to date, there is a continuing demand for further downsizing of the memory cell area.

To meet this demand, therefore, several methods have been proposed, including a trench type or a stack type capacitor, which uses a three-dimensional structure to reduce the cell area required to form the capacitor. However, the process of manufacturing a three-dimensional capacitor structure is long, tedious and complicated, and consequently involves high manufacturing cost. Therefore, a strong demand exists for a new memory device that can reduce the cell area necessary to hold the requisite volume of information without requiring complex manufacturing steps.

In attempting to meet this requirement, proposals have been to use a ferroelectric random access memory (FeRAM) in which a thin film capacitor having ferroelectric properties, such as strontium bithmuth tantalate (SBT) or lead zirconate titanate (PZT), is used as the capacitor dielectric in place of the conventional silicon oxide or silicon nitride films.

In FIG. 1, there is shown a cross sectional view setting forth a conventional semiconductor memory device 100 for use as a FeRAM. The semiconductor memory device 100 includes an active matrix 8 incorporating a transistor, a capacitor structure 22 having a bottom electrode 15, a capacitor dielectric thin film 16 and a top electrode 17. Also shown in FIG. 1 are an isolation region 11, a word line 12, diffusion regions 13, a first insulating layer 14, a second insulating layer 18, a metal interconnection 19A and a bit line 19B.

The process for manufacturing the conventional semiconductor memory device 100 begins with the preparation of the active matrix 8 having the silicon substrate 10, the transistor formed thereon as a selective transistor, the isolation region 11 and the first insulating layer 14 formed on the transistor and the isolation region 11. The transistor includes the diffusion regions 13 as a source and a drain.

In subsequent steps, the bottom electrode 15, the capacitor thin film 16 and the top electrode 17, are formed sequentially on the first insulating layer 14 of the active matrix 8. The capacitor thin film 16 comprises a ferroelectric material. The bottom and top electrodes 15, 17 are deposited using a sputter process and the capacitor thin film 16 is formed using a spin-on coating process. The electrodes 15, 17 and the capacitor thin film 16 are then patterned and etched to form a predetermined configuration.

In a next step, the second insulating layer 18 is formed on top of the active matrix 8 and the capacitor structure 22 using a plasma chemical vapor deposition (CVD). Openings are then formed in the second insulating layer 18 and the first insulating layer 14 of the active matrix 8 at positions over the diffusion regions 13 of the transistor and the top electrode 15 of the capacitor structure 22 by reactive ion etching (RIE).

Finally, the metal interconnection layer 19A is formed over the entire surface and is patterned and etched to form the bit line 19B and a metal interconnection 19A, as shown in FIG. 1.

One of the major shortcomings of the above-described semiconductor memory device 100 and the related method for manufacturing such devices is the difficulty in reducing the cell area because the capacitor structure 22 is not vertically aligned with the associated transistor and thus consumes additional surface area.

Referring to FIG. 2, there is shown a cross sectional view setting forth another conventional semiconductor memory device 200 for use as FeRAM, that overcomes the noted shortcomings of the semiconductor memory device 100. The semiconductor memory device 200 includes an active matrix 31 incorporating a transistor, an isolation region 21, an insulating layer 24, a word line 22, a bit line 25, a conductive plug 26, e.g., a polysilicon plug, a barrier layer 27 for protecting the capacitor 32 during high temperature thermal treatment such as annealing and crystallization, and a capacitor structure 32 having a bottom electrode 28, a capacitor dielectric thin film 29 and a top electrode 30.

In comparison with the semiconductor memory device 100, the memory device 200 has the advantage of reduced cell size. That is, the capacitor structure 32 is positioned over the conductive plug 26 so that it is possible to reduce the cell area in comparison with the memory device 100 depicted in FIG. 1. However, since the capacitor structure 32 is in direct contact with the conductive plug 26, the memory device 200 has a drawback in that a barrier layer is typically needed to protect against Si inter-diffusion phenomenon during high thermal treatment. And the memory device 200 has another drawback in that the manufacturing cost is increased because the polysilicon plug is formed using a chemical mechanical polishing (CMP) method. Furthermore, the memory device 200 has still another drawback in that the step height and aspect ratio for forming the storage node is increased to a degree that renders it difficult to obtain good step coverage.

SUMMARY OF THE INVENTION

It is, therefore, an object of the present invention to provide a semiconductor memory device having a reduced cell area by forming capacitor structure at a position over the corresponding transistor and connecting them to each other indirectly.

It is another object of the present invention to provide a method for manufacturing a semiconductor memory device having a compact cell size by forming a capacitor structure at a position over the corresponding transistor and connecting them to each other indirectly.

In accordance with one aspect of the present invention, there is provided a semiconductor memory device, comprising: an active matrix provided with a semiconductor substrate, a transistor formed on the semiconductor substrate and isolation regions for isolating the transistor; a first metal pattern formed on top of the active matrix and extending outside the transistor; a capacitor structure formed over the transistor; a barrier layer formed on top of the capacitor structure to thermally stabilize the capacitor; and a second metal pattern formed on top of the capacitor structure for electrically connecting the capacitor structure to the transistor through the first metal and second metal patterns.

In accordance with another aspect of the present invention, there is provided a method for manufacturing a semiconductor memory device, the method comprising the steps of: a) preparing an active matrix including a semiconductor substrate, a transistor formed on top of the semiconductor substrate and a first insulating layer formed around the transistor; b) forming a first metal layer and patterning and etching the first metal layer to form a first predetermined configuration to obtain a first metal pattern for electrically connecting the transistor thereto; c) forming a second insulating layer on top of the first metal pattern; d) forming a capacitor structure on the second insulating layer at a position over the transistor; e) forming a barrier layer on top of the capacitor structure and patterning and etching the barrier layer into a second predetermined configuration to make the capacitor thermally stabilize; and f) forming a second metal layer and patterning and etching the second metal layer into a third predetermined configuration to electrically connect the second metal pattern to the first metal pattern.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
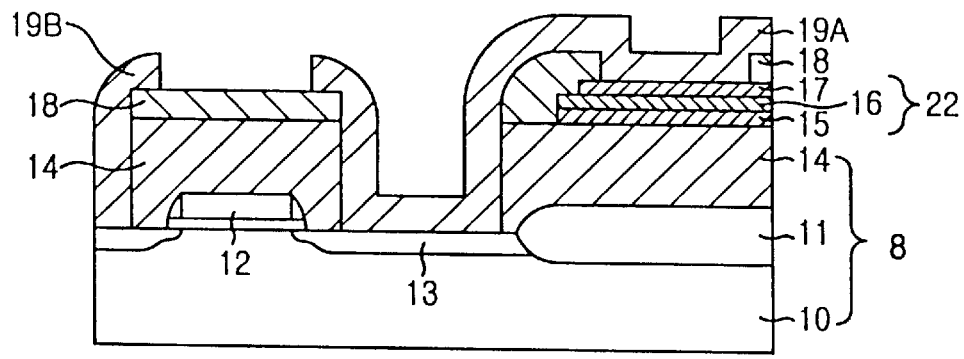
FIG. 1 shows a cross sectional view representing a prior art semiconductor memory device having a capacitor structure.
Figure 2:
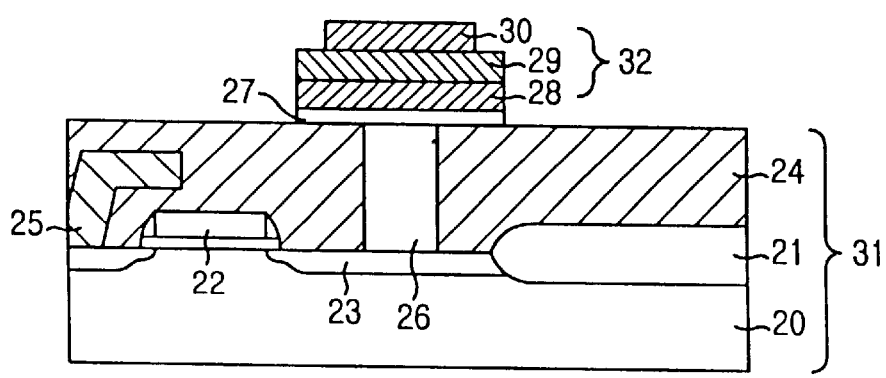
FIG. 2 is cross sectional view illustrating another prior art semiconductor device, which has a capacitor positioned over a transistor.

FIGS. 3 and 4A to 4H provide a cross sectional view of a semiconductor memory device 300 and cross sectional views illustrating a method for the manufacture thereof in accordance with preferred embodiments of the present invention. It should be noted that corresponding parts and structures that appear in FIGS. 3 and 4A to 4G are designated with identical reference numerals.

Figure 3:
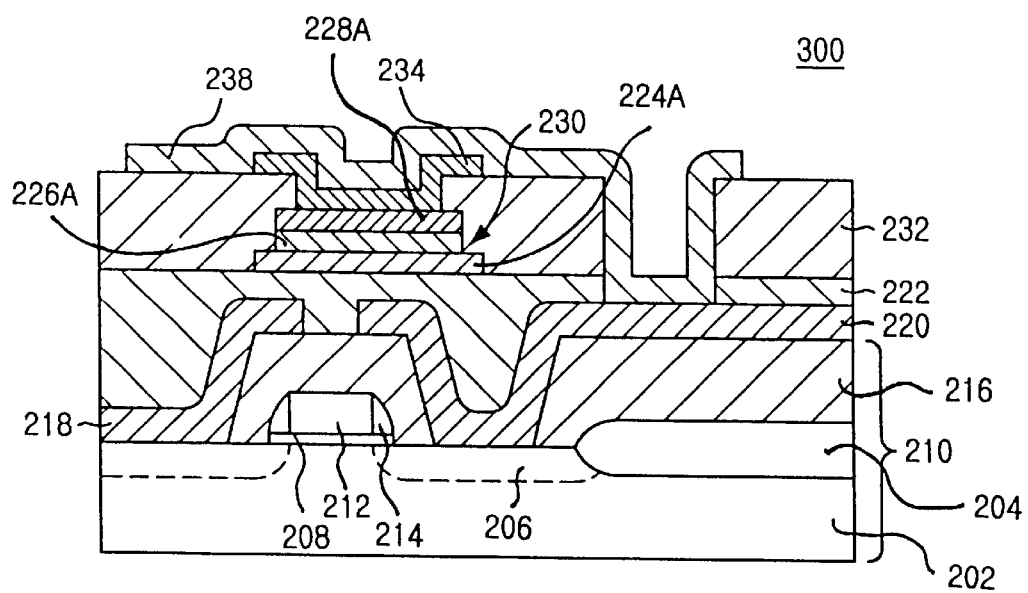
FIG. 3 is a cross sectional view setting forth a semiconductor memory device provided with a capacitor structure in accordance with the present invention.

FIG. 3 provides a cross sectional view of the inventive semiconductor memory device 300 comprising an active matrix 210, a bit line 218, a leading pad 220, a capacitor structure 230 and a local interconnection line 238.

The active matrix 210 includes a semiconductor substrate 202, an isolation region 204, diffusion regions 206, a gate oxide 208, a gate line 212 formed on top of the gate oxide 208, a spacer 214 formed around the gate line 212 and a first insulating layer 216. In the semiconductor memory device 300, the bit line 218 is electrically connected to one of the diffusion regions 206 and the top electrode 228A of the capacitor structure 230 is electrically connected to the other diffusion region 206 through the leading pad 220 and the local interconnection line 238. The bit line 218 and the leading pad 220 are electrically isolated from each other. The bottom electrode 224A may be connected to a plate line (not shown) to apply a common constant potential thereto. Although, as shown, the electrical contact between the leading pad 220 and the local interconnection line 238 occurs at a position over the isolation region 204, the electrical contact can be formed at other positions that can be used to reduce the cell area of the semiconductor memory device 300. It should be understood that the present invention is not limited to the use of any specific shape of the leading pad 220 or the local interconnection line 238, the only requirement being that they provide the intended electrical operation to the semiconductor memory device 300.

FIGS. 4A to 4H are schematic cross sectional views setting forth the method for manufacture of a semiconductor memory device 300 in accordance with the present invention.

Figure 4A:
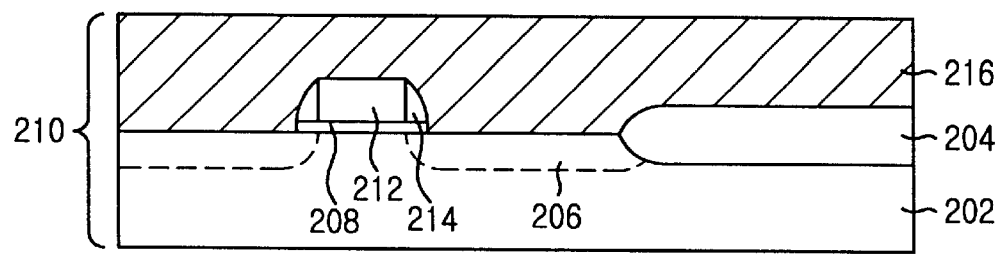
FIGS. 4A to 4H are schematic cross sectional views setting forth a method for the manufacture of the semiconductor memory device provided with the capacitor structure in accordance with the present invention.

The process for manufacturing the semiconductor memory device 300 begins with the preparation of an active matrix 210 including a semiconductor substrate 202, an isolation region 204, diffusion regions 206, a gate oxide 208, a gate line 212, spacers 214 and a first insulating layer 216. One of the diffusion regions 206 serves as a source and the other diffusion region 206 serves as a drain, as shown in FIG. 4A.

Figure 4B:
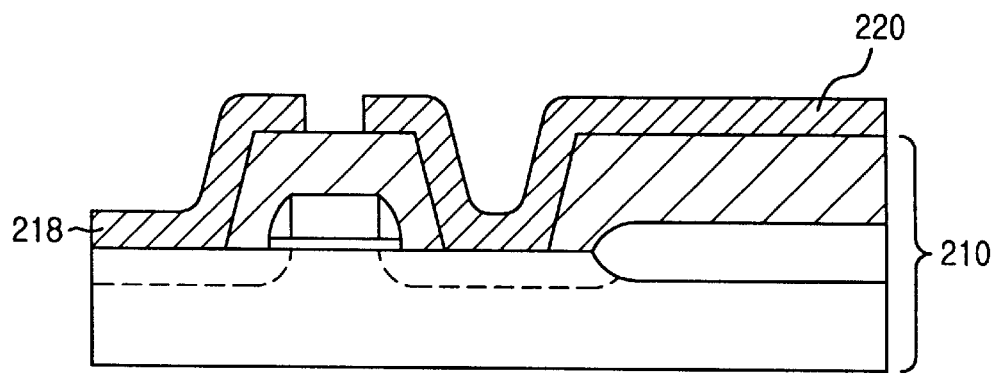

Thereafter, the first insulating layer 216, made of a material, e.g., borophosphosilicate glass (BPSG), is patterned and etched into a predetermined configuration typically using conventional photolithography and etch methods to open top portions of the diffusion regions 206. A first interconnection metal layer is then formed on top of the active matrix 210 and patterned and etched into a first predetermined configuration, thereby obtaining both a bit line 218 and a leading pad 220, as shown in FIG. 4B. It should be noted that the bit line 218 and the leading pad 220 be formed during the same process. The first predetermined configuration is divided into a first shape corresponding to the bit line 218 and a second shape corresponding to the leading pad 220. The first interconnection metal layer can be made of a conducting material including, but not limited to: polysilicon doped with phosphorus (P), titanium silicide ($TiSi_2$), tungsten silicide ($WSi_2$), or other conductive materials, either singly or in combination.

Figure 4C:
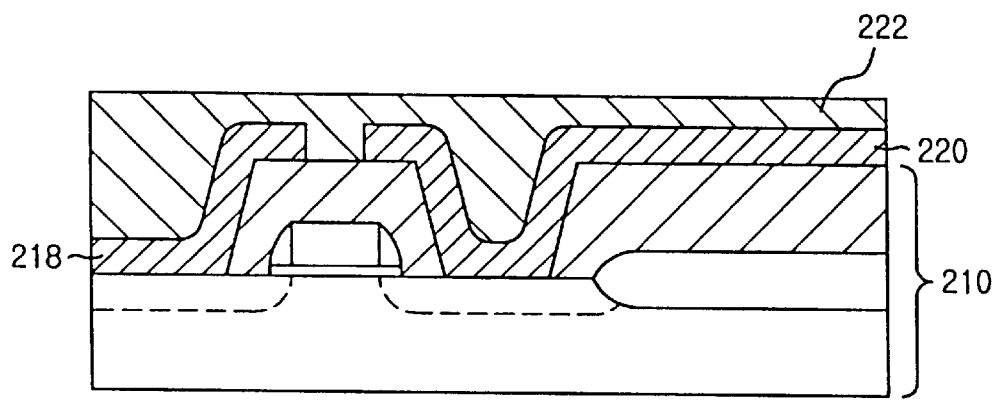

In an ensuing step, a second insulating layer 222, made of a material, e.g., BPSG, is formed on top of the bit line 218 and the leading pad 220 by using a method such as a chemical vapor deposition (CVD) and planarized by means of chemical mechanical polishing (CMP), as shown in FIG. 4C.

Figure 4D:
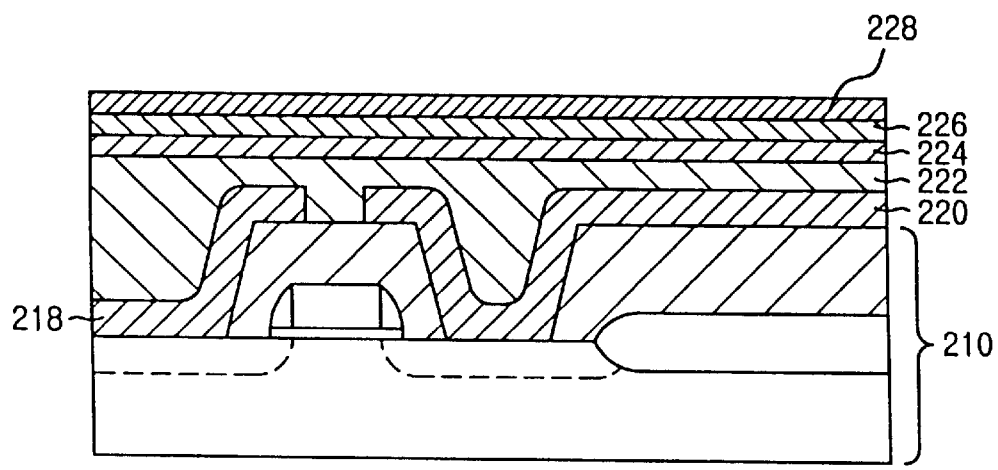

In subsequent steps, a first conductive layer 224, a dielectric layer 226 and a second conductive layer 228 are formed sequentially on top of the planarized second insulating layer 222 as shown in FIG. 4D. In the preferred embodiment, both of the first and the second conductive layers 224, 228 can be formed of a material such as platinum (Pt), iridium (Ir), ruthenium (Ru) or the like. It is possible that both of the first and the second conductive layers 224, 228 can be made of a material such as $IrO_2$, $RuO_2$, $LaSrCoO_x$ or the like. The dielectric layer 226 can be made of a ferroelectric material such as SBT ($SrBiTaO_x$), PZT ($PbZrTiO_x$) or the like.

Figure 4E:
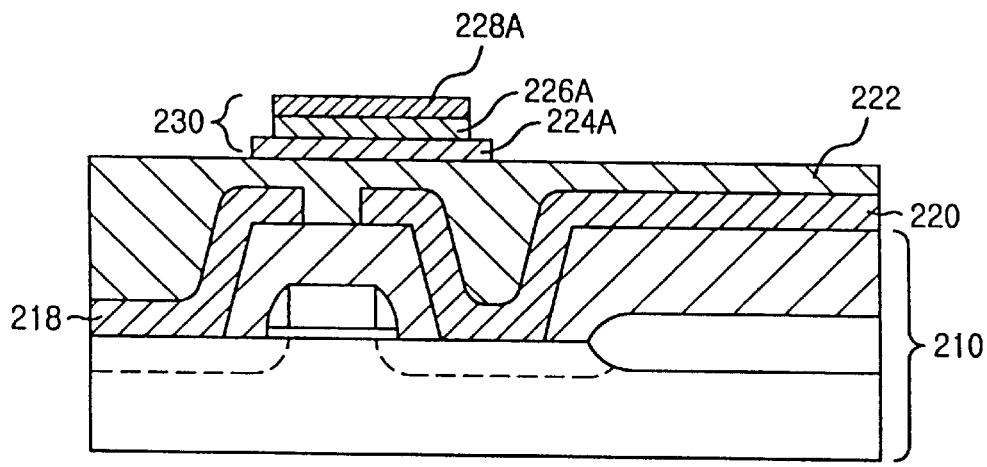

Thereafter, the second conductive layer 228 and the dielectric layer 226 are patterned and etched to form a second predetermined configuration to obtain a top electrode 228A and a capacitor dielectric thin film 226A. The first conductive layer 224 is then patterned and etched into a third predetermined configuration to obtain a bottom electrode 224A, thereby obtaining a capacitor structure 230 having the bottom electrode 224A, a capacitor thin film 226A and a top electrode 228A, as shown in FIG. 4E. It is preferable that the size of the third predetermined configuration be larger than that of the second predetermined configuration for forming a plate line (not shown) during subsequent processing.

Figure 4F:
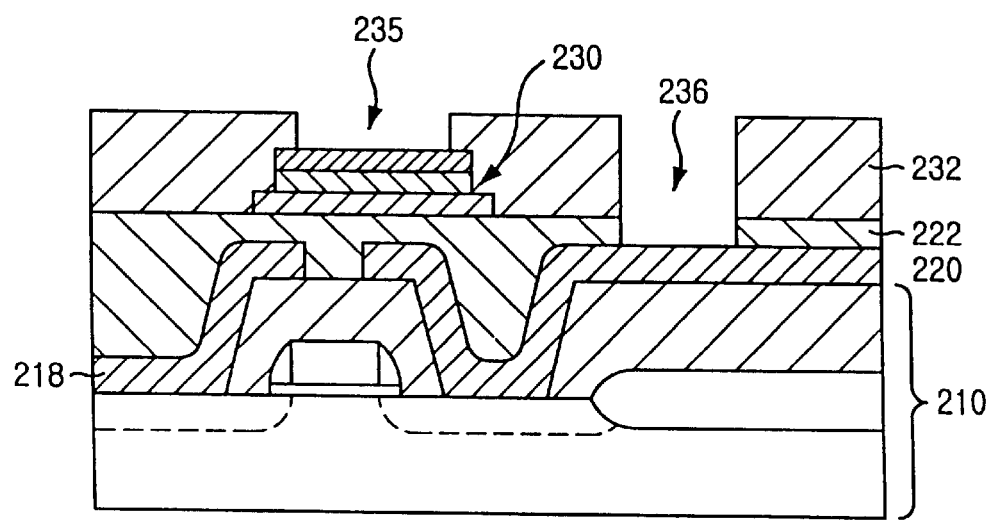

In a next step, a third insulating layer 232, BPSG, is formed on top of the second insulating layer 222 and the capacitor structure 230 using a method such as a plasma CVD and planarized using a method such as CMP. Openings 235 and 236 are then formed in the third insulating layer 232 and the second insulating layer 222 of the active matrix 210 at positions over the capacitor structure 230 and the leading pad 220, preferably using conventional photolithography and plasma etching processes, e.g., reactive ion etching (RIE), as shown in FIG. 4F. Although the semiconductor memory device 300 of FIGS. 3 and 4A to 4H is illustrated as having only one transistor and one capacitor structure 230, this is not intended as a limitation of the present invention. In other word, a memory device cell according to the present invention may comprise, for example, two transistors and two capacitors, in which one capacitor stores data and the other capacitor structure stores the complementary value of the data.

Figure 4G:
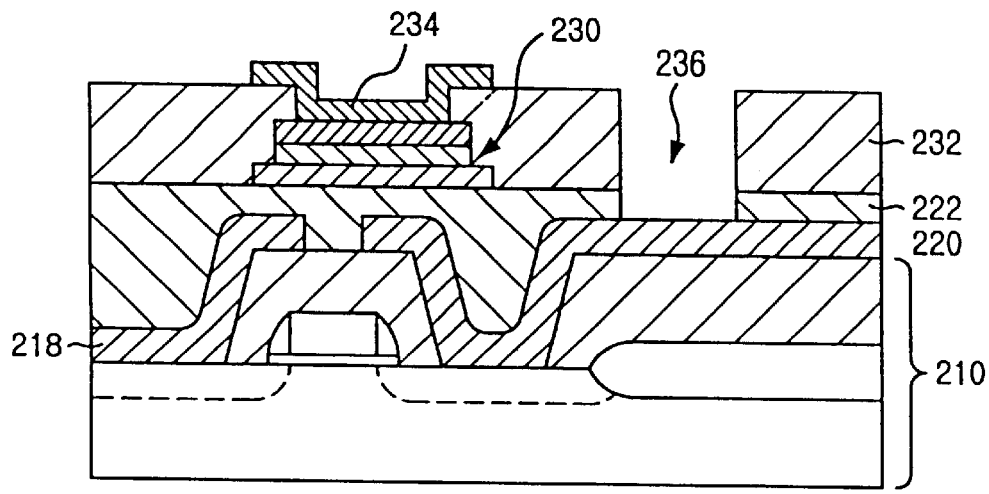

In an ensuing step, a third conductive layer 234 such as titanium nitride (TiN), iridium (Ir), ruthenium (Ru) or the like, is formed on top of the capacitor structure 230 and the second insulating layer 232 and then is patterned and etched into a fourth predetermined configuration using conventional photolithography and etch processes, as shown in FIG. 4G. This layer plays a role in protecting the top electrode 228A during subsequent high thermal treatment.

Figure 4H:
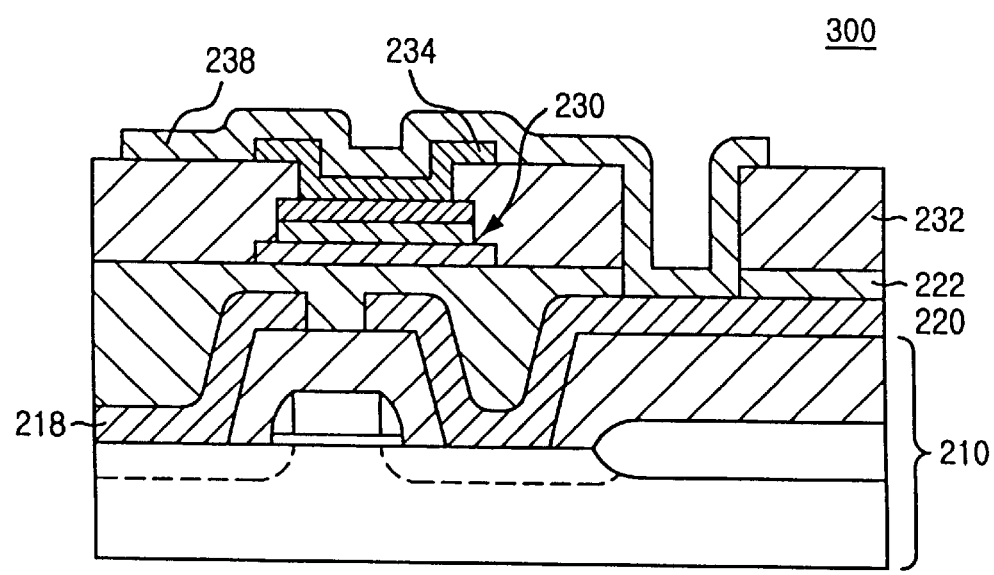

Finally, a second interconnection metal layer is formed over the entire surface and is patterned and etched into a predetermined configuration to form a local interconnection metal pattern 238, as shown in FIG. 4H. For example, the second interconnection metal layer can comprise a conductive material such as polysilicon doped with phosphorus, $TiSi_2$, $WSi_2$, or other conductive material. In the figures, each of the referenced layers is shown as that having a single layer structure for simplification, but multi-layer structures of compatible materials may also be used to form a referenced layer.

In comparison with the prior art, the present invention can reduce the cell area of the semiconductor memory device 300 by forming the capacitor structure 230 at a position over the gate line 212. This is achieved by utilizing the leading pad 220 and the local interconnection line 238.

And the present invention has an advantage in that it needs no additional processing to form the leading pad 220 since it is formed during the same process that forms the bit line 218.

Furthermore, since the present invention utilizes an indirect strapping method for connecting the semiconductor device instead of a direct plug contact, it is possible to protect the capacitor against deterioration resulting from subsequent high thermal treatments such as annealing and crystallizing the ferroelectric material. And it is possible for a memory device according to the present invention to obtain better step coverage than the previous art.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. A semiconductor memory device, comprising:

an active matrix formed on a semiconductor substrate, the active matrix comprising a transistor formed on the semiconductor substrate and isolation regions for isolating the transistor, the transistor comprising a gate insulator formed on the semiconductor substrate, a gate electrode formed on the gate insulator and two diffusion regions positioned on opposite sides of the gate electrode;

a first metal pattern including a leading pad connected to the transistor and extended over an isolation region and a bit line, wherein the bit line is electrically connected to one of the diffusion region and the leading pad electrically connected to the other diffusion region;

a capacitor, the capacitor being positioned above and generally vertically aligned with the transistor;

a barrier layer formed on the capacitor; and a second metal pattern, the second metal pattern being connected to the capacitor and the leading pad, thereby forming an electrical connection between the capacitor and the transistor.

2. The semiconductor memory device of claim 1, wherein the capacitor comprises a bottom electrode;

a top electrode, the top electrode being positioned above and generally vertically aligned with the bottom electrode; and a dielectric film disposed between the bottom electrode and the top electrode.

3. The semiconductor device of claim 2, wherein the dielectric film comprises a ferroelectric material selected from a group consisting of SBT ($SrBiTaO_x$) and PZT ($PbZrTiO_x$).

4. The semiconductor memory device of claim 2, further comprising a first insulating layer, the first insulating layer being disposed both between the gate electrode and the first metal pattern and between the isolation regions and the first metal pattern.

5. The semiconductor memory device of claim 4, further comprising a second insulating layer formed between the first metal pattern and the capacitor.

6. The semiconductor memory device of claim 5, wherein the electrical connection between the second metal pattern and the leading pad is made through a contact opening formed in the second insulating layer, the contact opening being located vertically above an isolation region.

7. The semiconductor memory device of claim 1, wherein the barrier layer comprises a material selected from the group consisting of titanium nitride (TiN), iridium (Ir), and ruthenium (Ru).

* * * * *